(12) United States Patent
Shepherd et al.

(10) Patent No.: US 9,323,878 B2
(45) Date of Patent: *Apr. 26, 2016

(54) METHOD OF OPTIMIZING THE DESIGN OF AN ELECTRONIC DEVICE WITH RESPECT TO ELECTROMAGNETIC EMISSIONS BASED ON FREQUENCY SPREADING INTRODUCED BY DATA POST-PROCESSING, COMPUTER PROGRAM PRODUCT FOR CARRYING OUT THE METHOD AND ASSOCIATED ARTICLE OF MANUFACTURE

(71) Applicants: John Avis Shepherd, Blagnac (FR); Kamel Abouda, Saint Lys (FR); Bertrand Vrignon, Plaisance du Touch (FR)

(72) Inventors: John Avis Shepherd, Blagnac (FR); Kamel Abouda, Saint Lys (FR); Bertrand Vrignon, Plaisance du Touch (FR)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/324,391

(22) Filed: Jul. 7, 2014

(65) Prior Publication Data
US 2015/0227663 A1   Aug. 13, 2015

(30) Foreign Application Priority Data
Feb. 7, 2014   (WO) .................. PCT/IB2014/000369

(51) Int. Cl.
*G06F 17/50* (2006.01)
(52) U.S. Cl.
CPC ........ *G06F 17/5068* (2013.01); *G06F 17/5036* (2013.01)

(58) Field of Classification Search
CPC .................................................. G06F 2217/82
USPC .................... 716/100, 106, 115, 132, 136
See application file for complete search history.

(56) References Cited

U.S. PATENT DOCUMENTS 3,668,294 A * 6/1972 Kameoka et al. ............... 84/698
3,675,124 A   7/1972 Ashley et al.
(Continued)

FOREIGN PATENT DOCUMENTS

WO   2012143749 A1   10/2012

OTHER PUBLICATIONS

Crisafulli, V. et al, "Model Based Design Tool for EMC Reduction Using Spread Spectrum Techniques in Induction Heating Platform", 13th International Conference on Optimization of Electrical and Electronic Equipment (OPTIM), May 24-26, 2012, IEEE Conference Publications, 2012, pp. 845-852.

(Continued)

*Primary Examiner* — Paul Dinh

(57) ABSTRACT

There is described a method of optimizing the design of an electronic device with respect to electromagnetic emissions based on frequency spreading. With the method, a designer can, for example, perform a transient simulation on the device only once, and then process the obtained signal data to add frequency spreading with specific parameters by post-processing. The resulting data can be filtered by various methods and the resulting spectrum observed. The designer can thus evaluate the reduction in electromagnetic emission level, and repeat this process by iteratively applying frequency spreading each time with specific parameters but without having to modify the schematic of the device and to perform another simulation of the device. The post-processing according to this innovation is extremely rapid as it is not a simulation process such as SPICE™, ADS™, etc. Only data is manipulated.

12 Claims, 6 Drawing Sheets

(56) References Cited

U.S. PATENT DOCUMENTS

| | | | |
|---|---|---|---|
| 4,446,446 A | | 5/1984 | Fowks |
| 4,539,530 A | * | 9/1985 | Mizumura et al. ...... 331/117 FE |
| 4,771,465 A | * | 9/1988 | Bronson et al. ............. 704/207 |
| 6,172,579 B1 | | 1/2001 | Dacus et al. |
| 6,278,870 B1 | | 8/2001 | Davie et al. |
| 6,842,727 B1 | * | 1/2005 | Hayashi ......................... 703/18 |
| 7,039,572 B1 | * | 5/2006 | Narahara et al. ................ 703/14 |
| 7,222,033 B1 | * | 5/2007 | Newson et al. ................. 702/65 |
| 2002/0045995 A1 | * | 4/2002 | Shimazaki et al. ............ 702/77 |
| 2005/0289497 A1 | | 12/2005 | Matsumoto |
| 2006/0003717 A1 | | 1/2006 | Sowlati |
| 2006/0040634 A1 | | 2/2006 | Wang |
| 2006/0132118 A1 | * | 6/2006 | Maekawa et al. ............... 324/96 |
| 2006/0173662 A1 | | 8/2006 | Kazama et al. |
| 2006/0252396 A1 | | 11/2006 | Barak et al. |
| 2007/0086274 A1 | | 4/2007 | Nishimura et al. |
| 2007/0087720 A1 | | 4/2007 | Pullela et al. |
| 2008/0123777 A1 | | 5/2008 | Trager et al. |
| 2008/0157900 A1 | | 7/2008 | El Rai et al. |
| 2009/0147963 A1 | * | 6/2009 | Smith ............................. 381/62 |
| 2010/0148827 A1 | | 6/2010 | Olgaard |
| 2011/0306313 A1 | | 12/2011 | Jaisimha et al. |
| 2012/0313697 A1 | * | 12/2012 | Hafizovic et al. ............ 329/323 |
| 2014/0067273 A1 | | 3/2014 | Puryear et al. |
| 2014/0149088 A1 | * | 5/2014 | Kirsanov et al. ................. 703/2 |

OTHER PUBLICATIONS

Hormaier, K. et al, "An EMI Receiver Model to Evaluate Electromagnetic Emissions by Simulation," 2012 IEEE International Instrumentation and Measurement Technology Conference (I2MTC), May 13-16, 2012; pp. 2558-2562.

International Electrotechnical Commission, "CISPR 16-1-1 Specification for radio disturbance and immunity measuring apparatus and methods; Part 1-1: Radio disturbance and immunity measuring apparatus—Measuring apparatus"; First edition, Nov. 2003; Reference No. CISPR 16-1-1-2003; 138 pages.

Shepherd, J. et al, "Getting the Most Out of Frequency Spreading," Freescale Semiconductor, Inc., Toulouse, France; EMC Compo; 2009; 6 pages.

U.S. Appl. No. 14/324,392, filed Jul. 7, 2014, entitled "Method of Optimizing the Design of an Electronic Device With Respect to Electromagnetic Emissions Based on Frequency Spreading Introduced by Software, Computer Program Product for Carrying Out the Method and Associated Article of Manufacture".

U.S. Appl. No. 14/324,404, filed Jul. 7, 2014, entitled "Method of Optimizing the Design of an Electronic Device With Respect to Electromagnetic Emissions Based on Frequency Spreading Introduced by Hardware, Computer Program Product for Carrying Out the Method and Associated Article of Manufacture".

Lin, Chin-Yu et al., "An Offset Phase-Locked L00op Spread Spectrum Clock Generator for SATA III," IEEE 2010 Custom Integrated Circuits Conference; IEEE, Piscataway, NJ; ISBN: 978-1-4244-5760-1; Sep. 19, 2010; 4 pages.

Mori, Ibuki et al., "EMI Reduction by Spread-Spectrum Clocking in Digitall-Controlled DC-DC Converters," IEICE Transactions on Fundamentals of Electronics, Communications and Computer Sciences; Engineering Sciences Society, Tokyo, JP; vo. E92-A, No. 4; Apr. 1, 2009; pp. 1004-1011.

Non-Final Office Action mailed May 12, 2015 for U.S. Appl. No. 14/324,392, 18 pages.

Non-Final Office Action mailed May 11, 2015 for U.S. Appl. No. 14/324,404, 17 pages.

Final Office Action mailed Sep. 3, 2015 for U.S. Appl. No. 14/324,392, 4 pages.

Final Office Action mailed Sep. 3, 2015 for U.S. Appl. No. 14/324,404, 4 pages.

Notice of Allowance mailed Dec. 16, 2015 for U.S. Appl. No. 14/324,404, 6 pages.

Notice of Allowance mailed Feb. 4, 2016 for U.S. Appl. No. 14/324,392, 7 pages.

* cited by examiner

METHOD OF OPTIMIZING THE DESIGN OF AN ELECTRONIC DEVICE WITH RESPECT TO ELECTROMAGNETIC EMISSIONS BASED ON FREQUENCY SPREADING INTRODUCED BY DATA POST-PROCESSING, COMPUTER PROGRAM PRODUCT FOR CARRYING OUT THE METHOD AND ASSOCIATED ARTICLE OF MANUFACTURE

CROSS REFERENCE TO RELATED APPLICATIONS

The present application claims priority to International Application No. PCT/IB2014/000369, filed on Feb. 07, 2014, entitled "METHOD OF OPTIMIZING THE DESIGN OF AN ELECTRONIC DEVICE WITH RESPECT TO ELECTROMAGNETIC EMISSIONS BASED ON FREQUENCY SPREADING INTRODUCED BY DATA POST-PROCESSING, COMPUTER PROGRAM PRODUCT FOR CARRYING OUT THE METHOD AND ASSOCIATED ARTICLE OF MANUFACTURE," the entirety of which is herein incorporated by reference.

The present application is related to co-pending U.S. patent application Ser. No. 14/324,392, entitled "METHOD OF OPTIMIZING THE DESIGN OF AN ELECTRONIC DEVICE WITH RESPECT TO ELECTROMAGNETIC EMISSIONS BASED ON FREQUENCY SPREADING INTRODUCED BY SOFTWARE, COMPUTER PROGRAM PRODUCT FOR CARRYING OUT THE METHOD AND ASSOCIATED ARTICLE OF MANUFACTURE," filed on Jul. 07, 2014, and U.S. patent application Ser. No. 14/324,404, entitled "METHOD OF OPTIMIZING THE DESIGN OF AN ELECTRONIC DEVICE WITH RESPECT TO ELECTROMAGNETIC EMISSIONS BASED ON FREQUENCY SPREADING INTRODUCED BY HARDWARE, COMPUTER PROGRAM PRODUCT FOR CARRYING OUT THE METHOD AND ASSOCIATED ARTICLE OF MANUFACTURE," filed on Jul. 07, 2014, the entirety of which are herein incorporated by reference.

FIELD OF THE INVENTION

This invention relates to method of optimizing the design of an electronic device with respect to electromagnetic emissions based on frequency spreading, to a computer program product for carrying out the method and an associated article of manufacture.

BACKGROUND OF THE INVENTION

Electromagnetic compatibility (EMC) is a fundamental constraint that all electric or electronic equipments must meet to ensure the simultaneous operation of electric or electronic devices present at the same time in a given area, for a given electromagnetic environment.

By definition, EMC covers two complementary aspects: the electromagnetic (EM) emission and the immunity to electromagnetic interferences. When designing new electric or electronic devices, it is desirable to both keep the emission low and ensure robustness of the device, such that it complies with certain limits. Mainly, such EMC limits are defined by standards, e.g., CISPR 25, "Radio disturbance characteristics for the protection of receivers used on board vehicles, boats, and on devices—Limits and methods of measurement", IEC, 2002. Sometimes, more drastic limits may be defined by the customers. Moreover, the measurement equipment is described in CISPR 16-1-1 Specification for radio disturbance and immunity measuring apparatus and methods—Part 1-1: Radio disturbance and immunity measuring apparatus—Measuring apparatus. Simulation and measure of EM emissions during the design phase of integrated circuits allows evaluating signals that could cause spurious emissions leading to failure to meet the EMC specifications, before the product is first manufactured. Hence, when EM emission problems are detected by measurements on the manufactured device, the cost of redesign and manufacture may be prohibitive.

Therefore, it has become general practice to evaluate the signals that could cause spurious emissions leading to failure to meet the EMC specifications during the design phase of the device. At this stage it is relatively simple to modify the device to reduce the emission level by modifying the design.

For instance, when the maximum level of EM emissions at a given frequency specified by a standard or by customers is exceeded, the performance can be improved by spreading the signal at a specific frequency over a band of frequencies. Indeed, frequency spreading is often used to reduce the susceptibility of a receiver to an aggressor or to reduce the effect of a transmission on a victim.

The difficulty is to determine the optimum parameters for the frequency spreading, which may include the form of the modulating signal (ramp, triangle, stepped or linear, etc), the frequency of the modulating signal and the peak frequency deviation), without having to spend time simulating "real schematics" or, worse, having to generate numerous versions of the device to test different configurations.

Key principles of frequency spreading applied to EM emission reduction, as well as more general considerations regarding frequency spreading are disclosed in the publication by J. Shepherd, et al, "Getting the most out of frequency spreading", EMC Compo 2009.

The publication by K. Hörmaier, et al, "An EMI receiver Model to Evaluate Electromagnetic Emissions by Simulation", IEEE International Instrumentation and Measurement Technology Conference (I2MTC), 2012, discusses various methods of simulating an electromagnetic interference (EMI) test receiver.

Finally, the article by V. Crisafulli, et al, "Model Based Design Tool for EMC Reduction Using Spread Spectrum Techniques in Induction Heating Platform" discusses SPICE™ simulation of an equipment. The proposed method applies a previously calculated modulation waveform to the SPICE™ schematic of the equipment to be tested. The necessary circuitry for frequency spreading is already included in the SPICE™ schematic of the equipment.

However, the addition of the frequency spreading function into the existing schematic of the device under test (DUT) may be difficult to achieve, particularly when various combinations of frequency spreading parameters must be tried.

SUMMARY OF THE INVENTION

The present invention provides a method, a computer program product and an article of manufacture as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

A method of debugging electromagnetic emission problems during the design phase of an electronic device is presented. The device under test (DUT) may be an integrated circuit (IC), a part of an IC like a functional block also named an IP block in the art of electronic circuit design, or a complete system comprising an arrangement of various ICs or a System-on-Chip (SoC).

The device to be designed can be defined using a circuit-level modeling, and thus the simulation of the design can be carried out by means of a conventional circuit simulator. In further embodiments, however, a high-level behavioral block diagram modeling can be used for defining the electronic device to be designed. Still further, a mixed behavioral and circuit-level description can be used. Accordingly, a block oriented simulator, or a mixed-level behavioral and circuit simulation tool, respectively, can be used for the simulation. These variants allow optimizing the design of the electronic device with respect to electromagnetic emissions before decisions on implementation details at circuit level have to be made.

Embodiments of the invention rely on applying frequency spreading to an existing signal without the need to modify the device or part of the device generating the signal. Frequency spreading is applied by post-processing the existing signal. Embodiments of the invention can be implemented in any electronic design automation (EDA) or computer-aided design (CAD) tool. The method can be included in the toolbox of any simulator (such as SPICE™, ADS™ (Advanced Design System) available from Agilent, etc.) or mathematical software (such as Matlab™, for instance). It can be used as part of the design flow.

Because the illustrated embodiments of the present invention may for the most part, be implemented using hardware and/or software components known to those skilled in the art, details will not be explained in any greater extent than that considered necessary, for the understanding and appreciation of the underlying concepts of the present invention and in order not to obfuscate or distract from the teachings of the present invention.

Figure 1A:
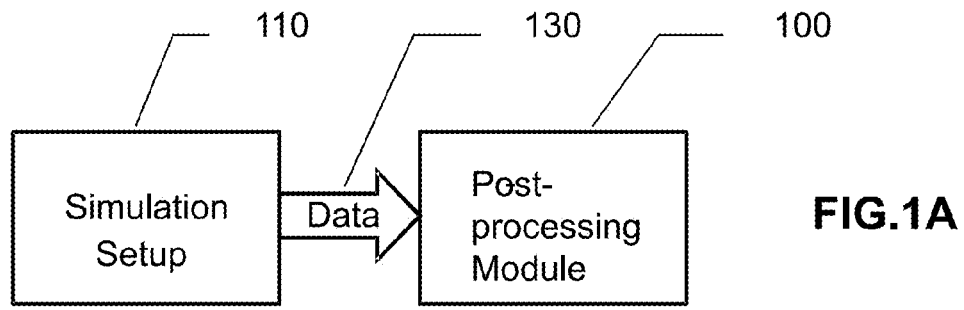
FIG. 1A is a schematic block diagram of a setup according to embodiments of the invention when applying frequency spreading to a signal resulting from an electrical simulation of an electronic device.

With reference to FIG. 1A, the method of applying frequency spreading may be applied by a post-processing apparatus 100 to a signal resulting from an electrical simulation of the device performed by using a simulation setup 110. In a variant illustrated by FIG. 1B, the processed signal may be a real signal at a pin or terminal of a device measured with a measurement setup 120, for example an oscilloscope.

Figure 1B:
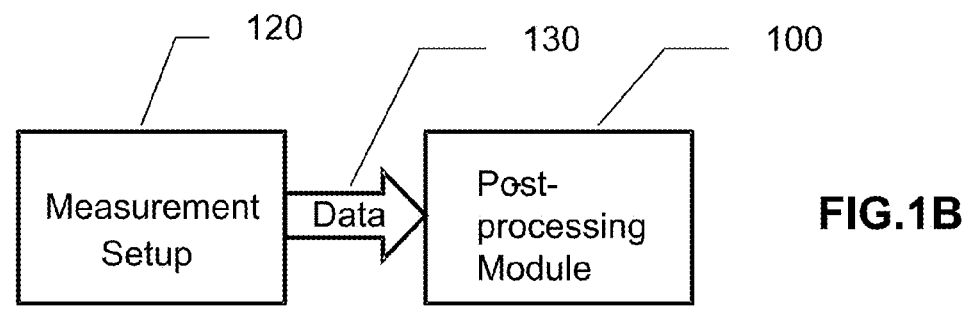
FIG. 1B is a schematic block diagram of a setup according to embodiments of the invention when applying frequency spreading to a measured signal.

In both cases as illustrated by FIG. 1A and FIG. 1B, the frequency spreading is applied by post-processing the existing signal whose data 130 results from the electrical simulation or from the measurement, respectively. The resulting data 130 can be filtered by the post-processing apparatus 100 using various well known methods and the resulting spectrum can be observed. Advantageously, the schematic of the device generating the signal does not need to be modified when testing the reduction of electromagnetic emissions achieved by frequency spreading.

The technical result which is achieved is that reduction in the electromagnetic emissions of an electronic device using frequency spreading can be optimized without the need to modify the device for performing such optimisation. Stated otherwise, embodiments of the invention offer the possibility of trying various frequency spreading parameters by applying frequency spreading to an existing signal generated by the device under test, without modifying the device or part of the device generating the signal for each try.

Data from a transient simulation or from acquisition of a real signal is typically a list of time-voltage pairs (piece-wise linear), which may be stored in a simple data structure like a memory table.

Modifying, namely compressing or expanding the timescale of the time-value pairs amounts to changing the frequency of the signal. Namely, it is possible to change the frequency of the signal and any harmonics thereof, by compressing or stretching the time scale. The corresponding length in time t' of the signal data is given by:

$$t' = t \times \frac{f_c}{f_c + \Delta f} \quad (1)$$

where:
t' is the new length in time of the signal data
t is the original length in time of the signal data
$f_c$ is the original carrier frequency
$\Delta f$ is the required frequency change
This can be achieved, for instance, by modifying the time values of the data.

Figure 2:
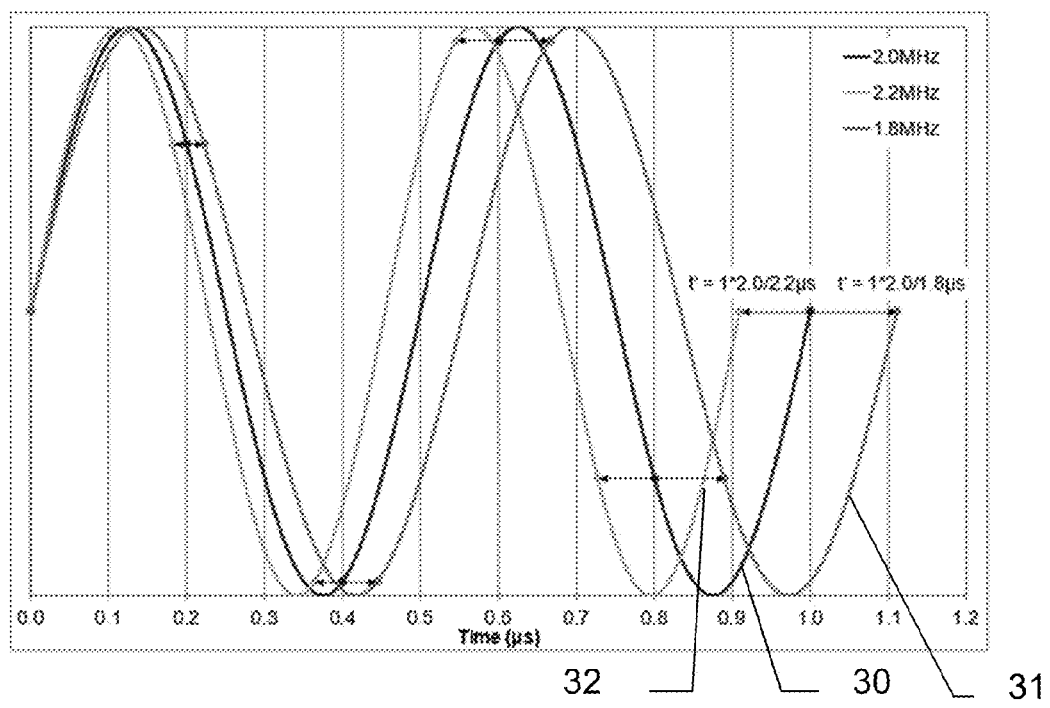
FIG. 2 is a graph of the sinewave voltage as a function of time, and of two versions thereof obtained by stretching and compressing the time scale, respectively.

With reference to FIG. 2, let us consider an original signal which, in the example as shown, is a 2.0 MHz sinewave 30 over a time period of 1 µs. The corresponding signal data may be compressed to give a 2.2 MHz sinewave 32, and it may also be stretched to give a 1.8 MHz sinewave 31. In other words, expanding the timescale by e.g. 10% allows increasing the frequency by 0.2 MHz to 2.2 MHz thereby obtaining the sinewave 32. On the contrary, compressing the timescale by e.g. 20% allows decreasing the frequency by 0.2 MHz to 1.8 MHz thereby obtaining the sinus signal 31. In both cases, each point on the waveform 31 or 32 is shifted in time proportionally to the original time value on the waveform 30.

When the shift in frequency Δf varies with time t, as is the case with frequency modulation, the corresponding time shift depends also on the instantaneous level of the modulating signal m(t) at the time considered.

Figure 3:
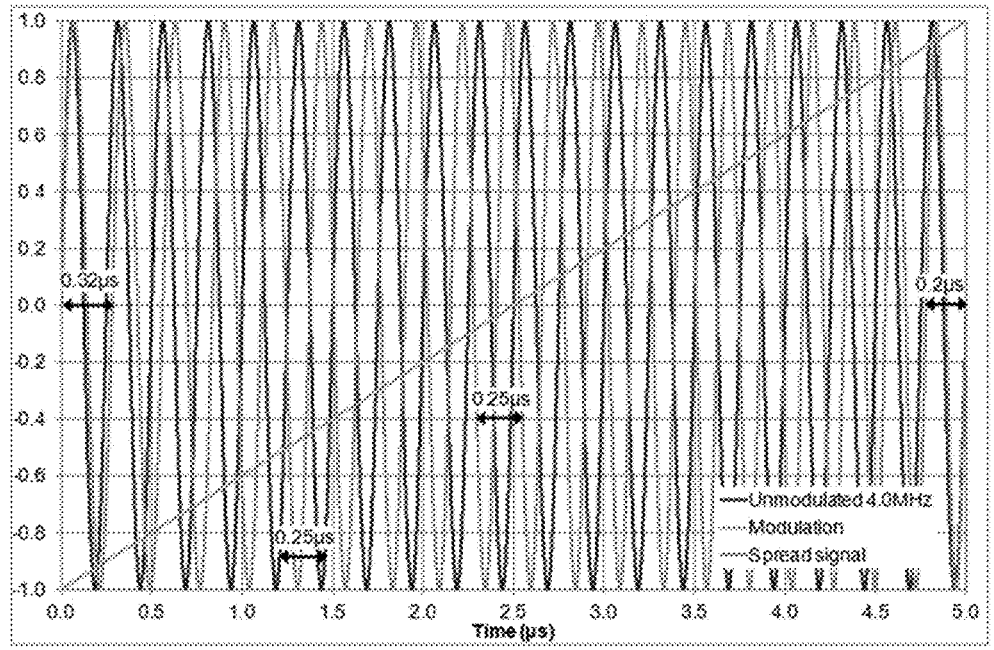
FIG. 3 is a graph of the sinewave voltage with modulated stretching and compressing of the time scale depending on a modulation signal.
Figure 4:
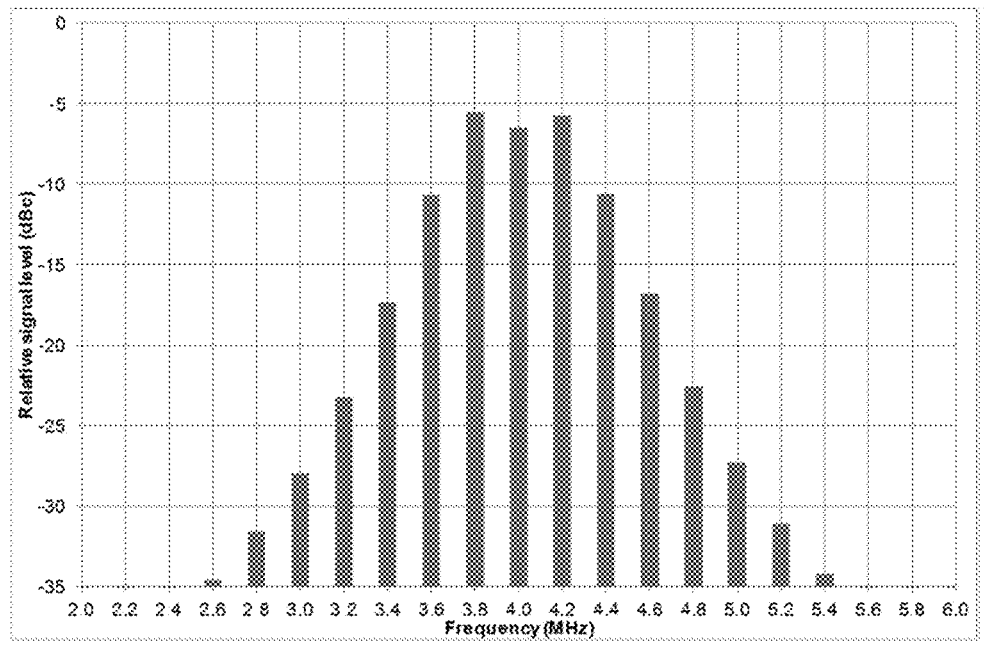
FIG. 4 is a spectrum diagram showing the spectrum of the spread signal of FIG. 3.

With reference to FIG. 3, for instance, a 4 MHz sinewave voltage is frequency modulated with a 200 kHz ramp signal m(t). In the centre of the ramp, when it is zero, i.e. m(t)=0 for t=0, the period of the sinewave is 0.25 µs corresponding to a frequency of 4 MHz. The first cycle of the sinewave, when the level of the modulating signal is close to −1, has a period of 0.32 µs corresponding to a frequency of about 3 MHz. The last cycle of the sinewave, when the level of the modulating signal is close to 1, has a period of 0.2 µs corresponding to a frequency of 5 MHz. In this case, the new time $t_n'$ may be calculated at each time value $t_n$ by:

$$t_n' = t_{n-1}' + \frac{f_C}{f_C + \Delta f \times m(t)} \times (t_n - t_{n-1}) \quad (2)$$

where:
$t_n'$ is the new length in time
$t_n$ is the original length in time
$f_c$ is the original carrier frequency (4 MHz in the case of FIG. 3)
$\Delta f$ is the required peak frequency deviation (1 MHz in the case of FIG. 3)
m(t) is modulating signal as a function of time t FIG. 4 shows the same frequency spread signal as in FIG. 3, but in the frequency domain. What the spectrum of FIG. 4 illustrates is that compressing or expanding the timescale as a function of the modulation signal provides frequency spreading.

The method of frequency spreading according to the invention can be applied to any waveform. If the waveform contains a fundamental frequency and harmonics, the frequency deviation of each harmonic is the frequency deviation of the fundamental frequency multiplied by the order of the harmonic. It will be appreciated by the one with ordinary skills in the art, that this is also the case in frequency spreading implemented in a real device.

Figure 5:
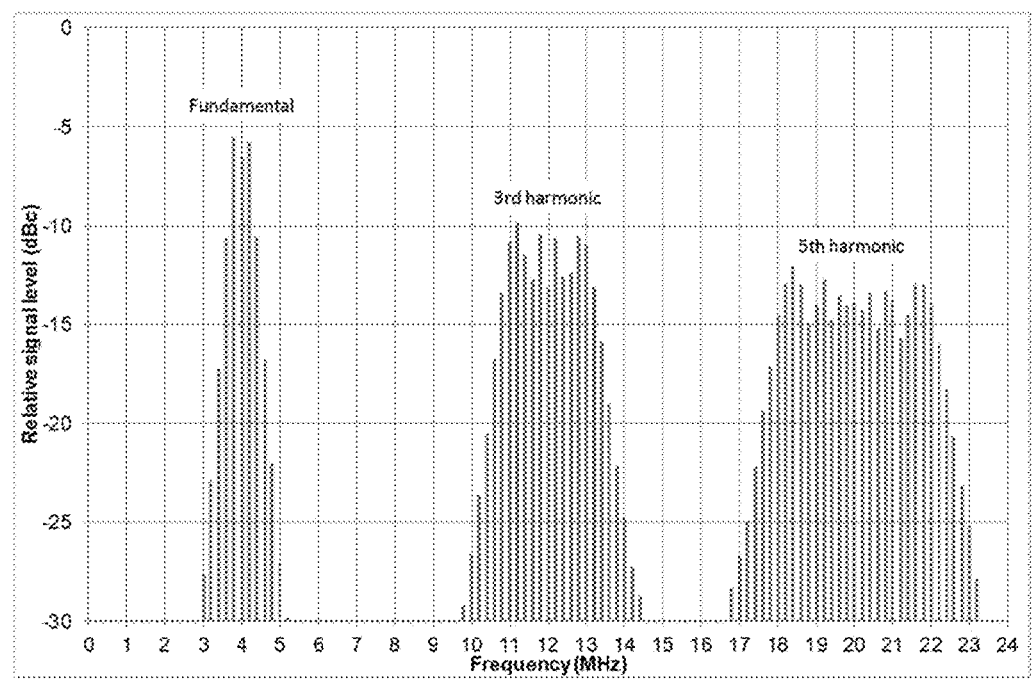
FIG. 5 is a spectrum diagram showing the spectrum of a spread signal having a fundamental frequency and $3^{rd}$ and $5^{th}$ harmonics.

In the example as shown in the spectrum diagram of FIG. 5, for instance, the original signal has a fundamental frequency at 4 MHz, and $3^{rd}$ and $5^{th}$ harmonics at 12 MHz and 20 Mhz, respectively. The spectrum of the corresponding spread signal as shown thus contains energy in frequency bands whose width is in a ratio of 1 to 3 and 1 to 5, respectively, with respect to the frequency band associated to the fundamental frequency. The unmodulated fundamental and harmonics are all at 0 dBc.

A more detailed embodiment of an apparatus suitable for carrying out the proposed method will now be described with reference to FIG. 6, in the case of a signal at a given test point of an electronic device (DUT), which is obtained by simulating said device.

Figure 6:
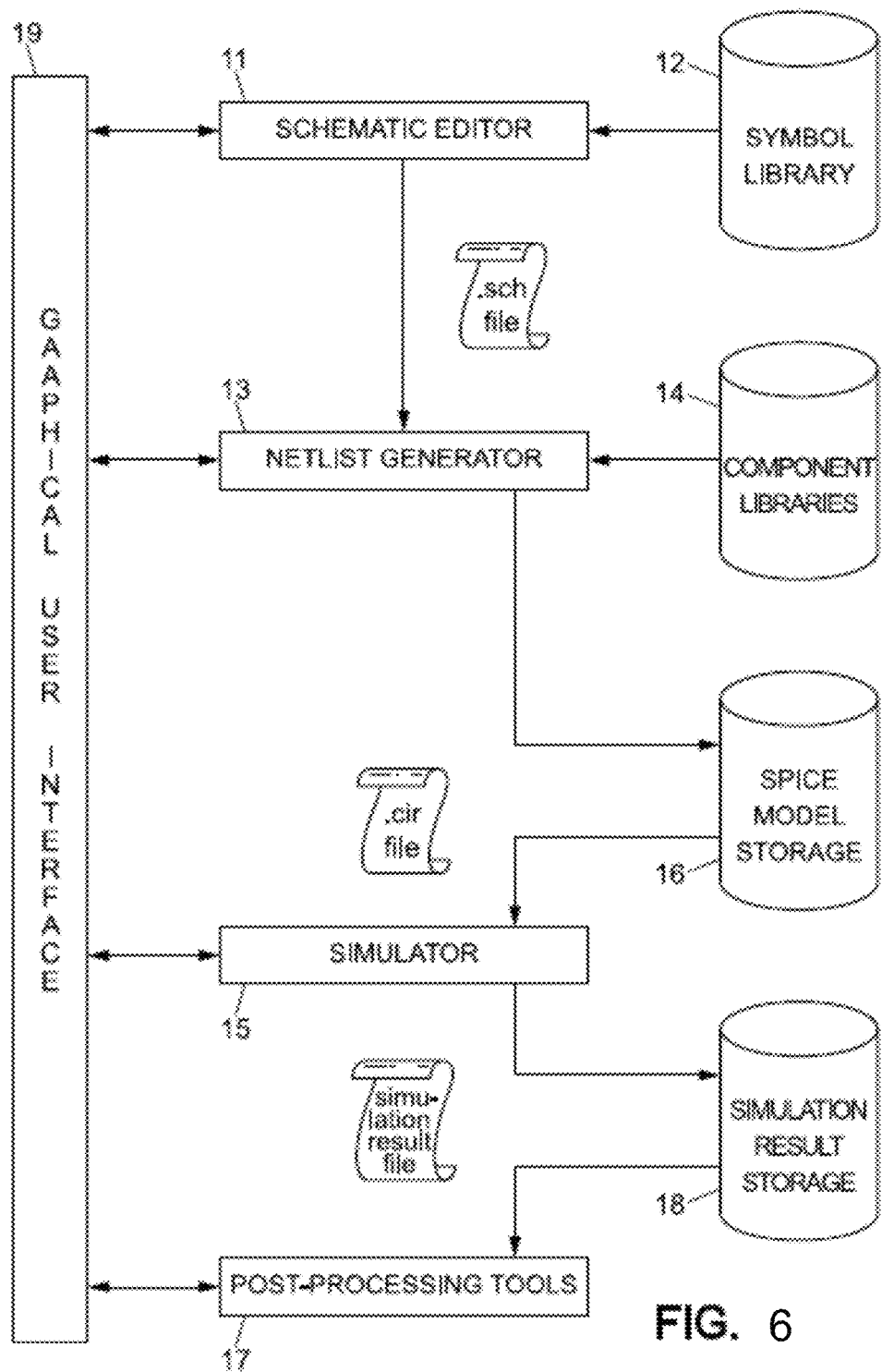
FIG. 6 schematically shows an example of an embodiment of a simulation apparatus adapted for carrying out embodiments of the method.

Indeed, FIG. 6 describes the general architecture of a simulation apparatus 10 which may embody the invention. The simulation apparatus may be based on the SPICE™ (Simulation Program with Integrated Circuit Emphasis) suite of software tools, and may be implemented as a programmable apparatus, such as a computer system. In the embodiment as shown, the device to be designed is defined using a circuit-level modeling, and the simulation of the design is carried out by means of a conventional circuit simulator. It will be appreciated by the one with ordinary skills in the art, however, that a high-level behavioral block diagram modeling or a mixed behavioral and circuit-level modeling can be used for defining the electronic device to be designed. In such embodiments (not shown), a block oriented simulator or a mixed-level behavioral and circuit simulation tool, respectively, can be used for the simulation.

The simulation apparatus 10 as shown in FIG. 6 comprises a schematic editor module 11 which is in charge of the edition of the schematic of the electronic device, and which may generate a file of the ".sch" type. The schematic editor may comprise, or is otherwise associated with, a symbol library 12 storing symbols of components used in the circuit design of the electronic device. Thus, the symbol library may be internal or external to the simulation device 10. This database, in one embodiment, may use an object-oriented approach to represent each component in the architecture of an IC, including: Central Processing Unit (CPU), on-chip network buses, functional blocks also referred to as IP (Intellectual property), power supply and ground planes, electrical interconnect (e.g., wiring), and other similar components. Unified schema objects of the database link the components together based on their logical and physical relationships.

Component models, adapted to describe the electrical characteristics and operation of all components of the electronic device, are provided by component libraries 14 of the apparatus. Some or all of these libraries may be external to the device.

The apparatus further comprises a netlist generator module 13, which generates a SPICE™ model of the electronic device adapted to serve as input file for a simulator module 15. This netlist file may be of the ".cir" type, that is to say a netlist format compatible with the analog simulation tool WinSPICE™. It contains the netlist description of the electronic device. It may be stored in a SPICE™ model storage unit 16, to become available to the simulator module 15.

The simulator module 15 may be a software processing unit configured to execute circuit simulation based on the model of the electronic device. It may be WinSPICE™, for instance. Alternative simulators, based on other component models may also be provided.

At the end of a simulation run, simulation results are made available in the form of a simulation result file, which may be accessed by post-processing tools 17. Different simulation result file formats may be supported by the apparatus. More than one simulation result file may be stored in a simulation result storage unit 18 which, again, may be internal or external to the computer system.

Finally, the simulation apparatus may comprise a Graphical User Interface (GUI) 19, which provides Input/Output functionality using, for example, editing and controlling icons and menus, viewing screens, plot printers, etc.

In particular, the level of EM emissions may be displayed to the user through the interface 19. This allows the user, during the design phase to check the operation of the various functions of the device and, in particular, to evaluate the signals that could cause spurious emissions leading to failure to meet the EMC specifications.

The design flow for optimizing the design of an electronic device with respect to electromagnetic emissions based on frequency spreading will now be described.

Figure 7:
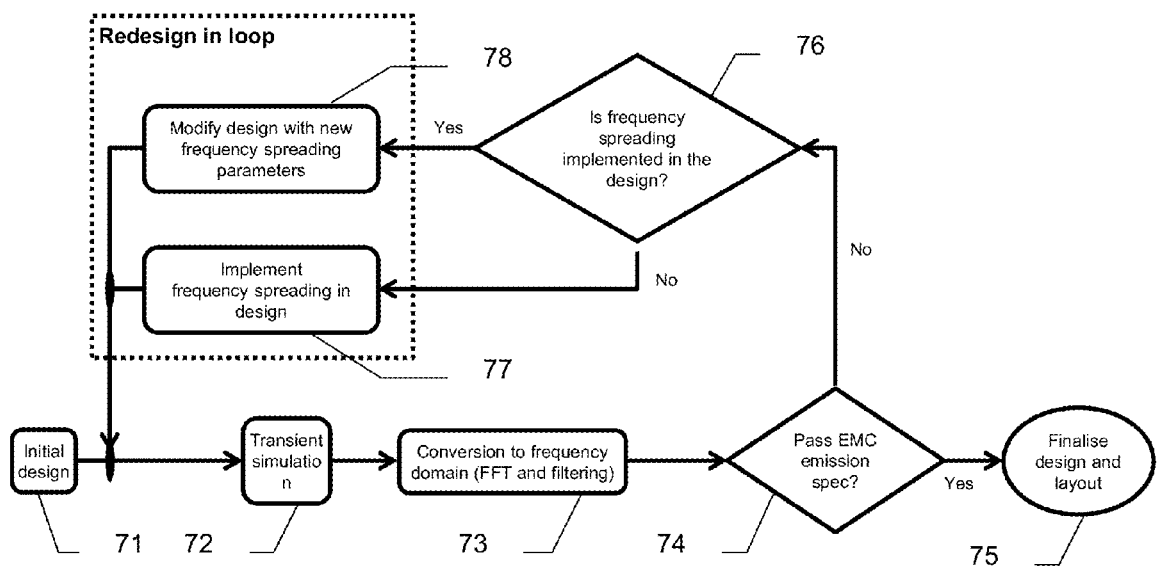
FIG. 7 is a flow diagram illustrating the design flow according to the prior art.

The design flow according to the prior art will first be presented with reference to the flow diagram of FIG. 7.

At 71, an initial design of the device is defined. This is performed by the user who, typically, may be an electronic circuit designer.

At 72, there is obtained at least one electrical signal at a given test point of the electronic device. In the shown example, this is achieved by simulating the electronic device, for instance by using the simulation apparatus described above with reference to FIG. 6. In the example as shown, this simulation may be a transient simulation.

At 73, the resulting simulation data can be converted to the frequency domain, for instance using a Fast Fourier transform (FFT) and filtered by various well known methods.

The resulting spectrum is then observed at 74. For example, the level of EM emissions may be displayed to the user through the GUI 19 of the apparatus of FIG. 6, so that the user may visually check whether there is an electromagnetic emission problem or not. For instance, an electromagnetic compatibility (EMC) test may be performed to determine whether the signal being tested does or not cause spurious emissions above a given threshold which would lead to failure to meet the EMC specifications by the actual device.

If not, then the EMC test is passed, and the design of the electronic device is finalized and its layout is computed, at 75. Else, a redesign of the electronic device is performed, in a looped process.

If frequency spreading is not implemented in the actual design of the electronic device, then the user will opt, at 77, to implement frequency spreading in the design as frequency spreading should be investigated as a possible solution. Else, namely when frequency spreading is readily implemented in the design, the user will likely modify the design by choosing new frequency spreading parameters at 78.

Then, the process loops to 72 where another simulation run is performed for the device with an added or newly defined frequency spreading function.

To summarize, having ascertained that the emissions of the device exceed the specified levels at certain frequencies, the designer must choose suitable parameters for the frequency spreading. These parameters include, for instance, the form of the modulating signal (ramp, triangle, stepped or linear, etc), the frequency of the modulating signal and the peak frequency deviation.

The design flow as shown in FIG. 7, however, suffers at least the following drawbacks:
- on-the-fly modifications to the design must be performed to find the optimum frequency spreading parameters, which modifications are time consuming; and,
- long simulations must be executed after each design modification, since the electronic device simulation performed at 72 lies in the loop of the design flow.

Figure 8:
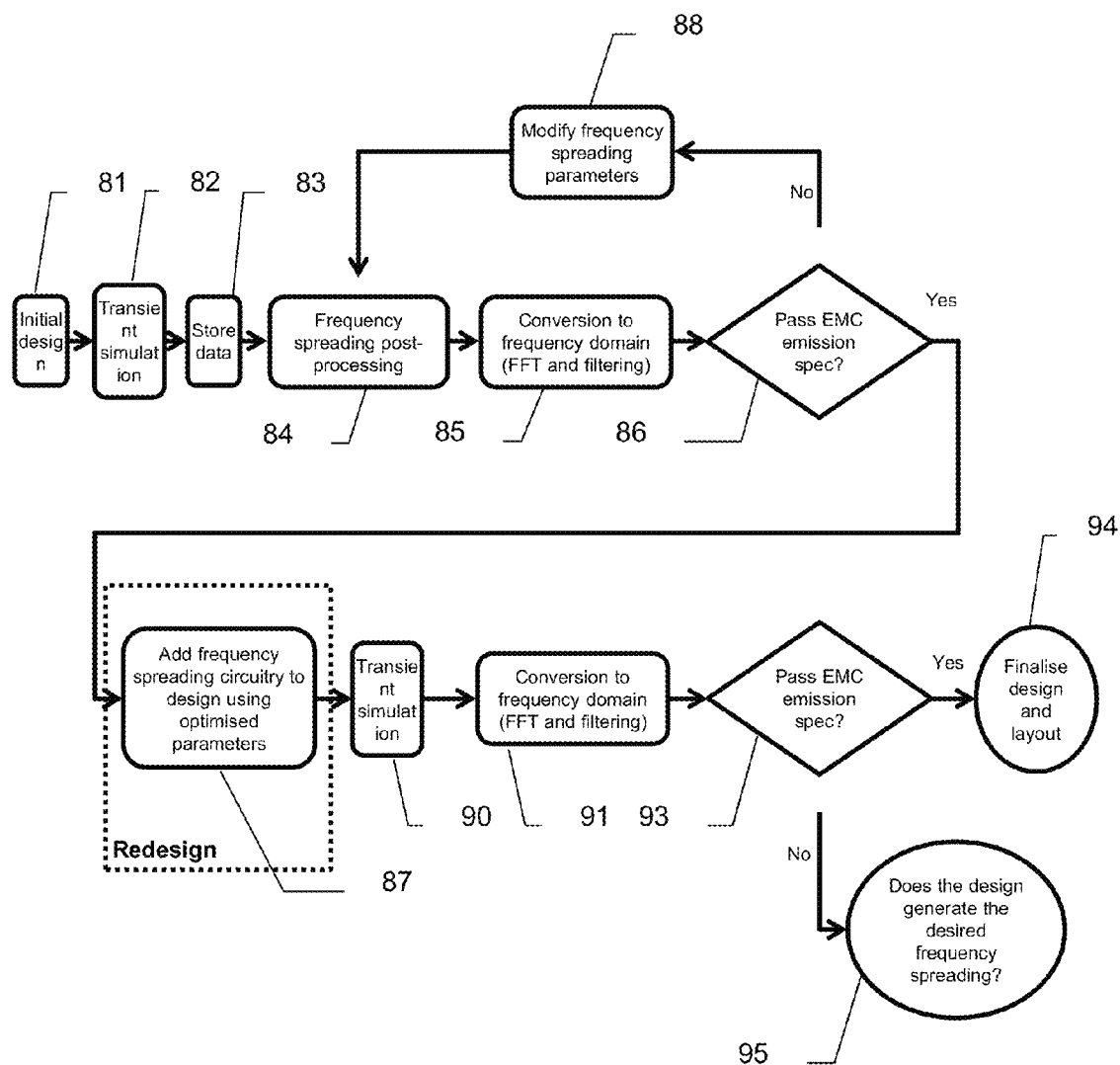
FIG. 8 is a flow diagram illustrating the design flow according to embodiments of the method.

The design flow according to embodiments of the present invention, allowing to alleviate the above inconvenient, will now be presented with reference to the flow diagram of FIG. 8. This design flow is implemented when it is assumed that no simple design solution can be found to reduce EMC emissions and that frequency spreading should be investigated as a possible solution.

At 81, an initial design of the device is defined. This is similar to the definition of the initial design performed at 71, in the design flow of FIG. 7 as described above.

At 82, there is obtained at least one electrical signal at a given test point of the electronic device. In the shown example, this is achieved by simulating the electronic device, for instance by using the simulation apparatus described above with reference to FIG. 6. In the example as shown, this simulation may be a transient simulation. This, also, is similar to the simulation of the initial design performed at 72, in the design flow of FIG. 7 as described above.

At 83, the resulting simulation data corresponding to this electrical signal is stored, for example in the simulation result storage unit 18 of FIG. 6, for post-processing.

Post-processing of the stored data is then performed, at 84. Said post-processing may comprise the following.

At the first iteration of 84, frequency spreading is applied to the electrical signal according to an initial set of frequency spreading parameters, suitable to reduce electromagnetic emissions of the device. This may be achieved by modifying the data stored at 83, with a frequency spreading modulation signal as was described above with reference to FIG. 2 to FIG. 4, for instance.

At 85, the resulting simulation data can be converted to the frequency domain, for instance using a FFT, and filtered by various well known methods. This, again, is similar to the conversion and filtering performed at 73 in the design flow of FIG. 7 as described above.

The resulting spectrum is then observed at 86. For example, the level of EM emissions may be displayed to the user through the GUI 19 of the apparatus of FIG. 6, so that the user may visually check whether there is an electromagnetic emission problem or not. In some embodiments a given EMC test is passed when the signal being tested does not cause spurious emissions above a given threshold which would lead to failure to meet the EMC specifications by the actual device.

If the EMC test is passed, then the design of the electronic device is modified at 87 to introduce a frequency spreading feature corresponding to the initial set of frequency spreading parameters.

Else, the steps of applying frequency spreading to the electrical signal and checking whether the frequency spread signal passes the EMC test are repeated, at 84 and 86, respectively, with respect to another set of frequency spreading parameters, different from the initial set of frequency spreading parameters. This set of frequency spreading parameters is selected at 88. Also, the frequency conversion and filtering performed at 85 are repeated. It will be appreciated, however, that the transient simulation which had been performed at 82 is not repeated. Stated otherwise, this simulation is performed only once in the design flow according to embodiments. This yields in a significant reduction in the time needed to optimize the design of the electronic device with respect to electromagnetic emissions using frequency spreading, compared with the prior art.

In some embodiments, the above steps may repeated until it is determined, at 86, that the EMC test is passed and the process jumps to the design modification at 87. More precisely, repeating the steps 84 of applying frequency spreading to the electrical signal and checking 86 whether the frequency spread signal passes the EMC test may be performed iteratively with respect to other, namely respective sets of frequency spreading parameters until the EMC test is passed or until an end condition of iterations is met. Such end condition can be met, for example, when a given number of iterations have been run, or when the reduction in the electromagnetic emissions caused by the frequency spread signal remains below a given threshold thus indicating that no significant improvement can be expected if iterations are continued further.

After the design has been modified at 87 to introduce a frequency spreading feature corresponding to the optimum frequency spreading parameters, another simulation run is launched at 90, to obtain electrical signals which may include at least the electrical signal at the test point previously considered. In the shown example, this simulation is a transient simulation performed by using, for instance, the simulation apparatus as described above with reference to FIG. 6. It will be appreciated that this transient simulation is a relatively long simulation (compared to simulation at 82) since it is a simulation with frequency spreading. This is similar to the further iterations of simulations (namely simulations other than the first one) performed at 72 with reference to FIG. 7, according to the design flow of the prior art. However, it will further be appreciated that, unlike the simulations 72 of FIG. 7 which are iteratively repeated, the relatively long transient simulation 90 of the invention is carried out only once.

At 91, the resulting simulation data can then be converted to the frequency domain, for instance using a Fast Fourier transform (FFT) and filtered by various well known methods so as to filter power out of the frequency band(s) of interest.

The resulting spectrum is then observed at 93. For example, the level of EM emissions may be displayed to the user through the GUI 19 of the apparatus of FIG. 6, so that the user may visually check whether the EMC test is passed. In practice, the test is passed when the signal being tested does not cause spurious emissions above a given threshold which would lead to failure to meet the EMC specifications by the actual device. This may be determined by the user with consideration of the spectrum of the signal thanks to the GUI 19 by any appropriate means.

If the EMC test is passed, then the design of the electronic device is finalized and its layout is computed, at 94. Else, a failure analysis may be performed, at 95, in order to check whether electronic device as redesigned to include the frequency spreading actually generates the expected frequency spreading or not. In cases where there are still EMC problems at that stage, a more in-depth redesign of the electronic device may need to be considered.

Advantages of the solution as described in the above include at least the following:
- no modifications to the design are required to find the optimum frequency spreading parameters;
- a relatively short transient simulation of the existing design (namely without frequency spreading) only needs to be carried out once at 82;
- the design is modified only once, at 87, when the optimum frequency spreading parameters have been determined; and,
- the relatively long transient simulation of the optimized design (namely with frequency spreading) only needs to be carried out once at 90.

To summarize, having ascertained, for instance by simulation or by measurements, that the emissions of a device exceed the specified levels at certain frequencies, the designer may decide to explore frequency spreading as a possible solution. What must be done is to choose suitable parameters for the frequency spreading, which are the form of the modulating signal (ramp, triangle, stepped or linear, etc), the frequency of the modulating signal and the peak frequency deviation. At this stage it is relatively simple to modify the device to reduce the emission level by adding frequency spreading.

With the invention the designer can, for example, perform a transient simulation on the device only once, and then process the obtained signal data to add frequency spreading with specific parameters by post-processing. The resulting data can be filtered by various methods and the resulting spectrum observed. The designer can thus evaluate the reduction in electromagnetic emission level, and repeat this process by iteratively applying frequency spreading each time with specific parameters but without having to modify the schematic of the device and to perform another simulation of the device.

Thus, the post-processing according to the invention is extremely rapid, as only the same set of signal data is manipulated at each iteration. The frequency spreading parameters can be modified and the post-processing can be run again. This way, many different configurations of frequency spreading parameters can be tested in a very short time. Therefore, the proposed method is considerably less time consuming than having to re-run transient simulations as is the case when the invention is not implemented and the frequency spreading function is added in the schematic of the device.

Indeed, designers are able to optimize frequency spreading parameters rapidly and apply them to the design of the device before the first tape-out, thereby avoiding costly redesign after EMC characterization.

The post-processing according to this innovation is extremely rapid as it is not a simulation process such as SPICE, ADS, etc. Only data is manipulated.

This method of frequency spreading can be applied to any waveform. If the waveform contains a fundamental frequency and harmonics, the frequency deviation of each harmonic is multiplied by the order of the harmonic, as is the case in frequency spreading implemented in a real device.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-rom or diskette, stored with data loadable in a memory of a computer system, the data representing the computer program. The data carrier may further be a data connection, such as a telephone cable or a wireless connection.

In the foregoing specification, the invention has been described with reference to specific examples of embodiments of the invention. It will, however, be evident that various modifications and changes may be made therein without departing from the broader spirit and scope of the invention as set forth in the appended claims. For example, the time-value pairs of which the signal data is constituted are not necessarily obtained from an electrical simulation of the device using a simulation apparatus as in the example described above with reference to FIG. 6 to FIG. 8. Indeed, time-value pairs defining the signal data may also be obtained from a time domain measurement. In some embodiment, this may be achieved by measuring a real signal at a test point of a real electronic device, which may be an external pin of the device pin or a terminal of a device measured, e.g., with an oscilloscope.

Some of the above embodiments, as applicable, may be implemented using a variety of different information processing systems. For example, although FIG. 6 and the discussion thereof describe an exemplary simulation architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

All or some of the software described herein may be received elements of system 10, for example, from computer readable media or other media on other computer systems. Such computer readable media may be permanently, removably or remotely coupled to an information processing system such as system 10. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

In one embodiment, system 10 is a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. For example, Also, devices functionally forming separate devices may be integrated in a single physical device.

Other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A method of optimizing the design of an electronic device with respect to electromagnetic emissions based on frequency spreading, the method comprising:
    defining an initial design of the device;
    obtaining at least one electrical signal at a given test point of the device and storing data corresponding to said electrical signal;
    post-processing the stored data, said post-processing comprising:
        applying frequency spreading to the electrical signal according to an initial set of frequency spreading parameters, suitable to reduce electromagnetic emissions of the device;
        checking whether the frequency spread electrical signal corresponding to the processed data passes a given electromagnetic compatibility, EMC, test;
        if the EMC test is passed, then modifying the design to introduce a frequency spreading feature with respect to the initial set of frequency spreading parameters;
        else, repeating applying frequency spreading to the electrical signal and checking whether the frequency spread signal passes the EMC test with respect to at least one other set of frequency spreading parameters, different from the initial set of frequency spreading parameters, and modifying the design to introduce a frequency spreading feature with respect to said other set of frequency spreading parameters if the EMC test is passed, wherein the optimizing the design of the electronic device is used to manufacture the electronic device.

2. The method of claim 1, wherein repeating applying frequency spreading to the electrical signal and checking whether the frequency spread signal passes the EMC test is performed iteratively with respect to other, respective sets of frequency spreading parameters until the EMC test is passed or until an end condition of iterations is met.

3. The method of claim 1, wherein the design of the device is defined at circuit level and/or at behavioral block level, and the electrical signal is obtained at the test point by electrical simulation of the device using a conventional circuit simulator, a block oriented simulator, or a mixed-level behavioral and circuit simulation tool.

4. The method of claim 1, wherein the electrical signal is captured at the test point by measurement performed on the device.

5. The method of claim 1, wherein checking whether the frequency spread electrical signal passes the EMC test comprises frequency filtering the frequency spread electrical signal and observing the resulting spectrum of the signal.

6. The method of claim 1, wherein the electrical signal is obtained from a transient simulation or from a time domain measurement, and the corresponding data is in the form of time-value pairs, wherein each of the time-value pairs comprises a corresponding time and a corresponding value for the corresponding time.

7. The method of claim 6, wherein applying frequency spreading comprises changing frequency of the signal by modifying a time scale of the time-value pairs.

8. The method of claim 7, wherein the change in frequency of the signal is varied with time as a function of an instantaneous level of a modulating signal at a time considered.

9. The method of claim 8, wherein the frequency spreading parameters comprise at least one of the form of the modulating signal, the frequency of the modulating signal and a peak frequency deviation.

10. The method of claim 1, wherein the electrical signal is in the form of a waveform containing a fundamental frequency and harmonics, and wherein a frequency deviation of any harmonic is obtained from the deviation of the fundamental frequency by multiplication of the deviation of the fundamental frequency by an order of the harmonic.

11. A computer program product comprising one or more stored sequences of instructions that are accessible to a processor and which, when executed by the processor, cause the processor to carry out the steps of claim 1.

12. An article of manufacture, comprising a machine-readable medium having machine-readable instructions stored thereon that are executable by a processor to carry out the steps of claim 1.

* * * * *